(12) United States Patent
Liu et al.

(10) Patent No.: US 9,934,344 B2
(45) Date of Patent: *Apr. 3, 2018

(54) ENHANCED PARAMETER TUNING FOR VERY-LARGE-SCALE INTEGRATION SYNTHESIS

(71) Applicant: INTERNATIONAL BUSINESS MACHINES CORPORATION, Armonk, NY (US)

(72) Inventors: Hung-Yi Liu, New York, NY (US); Matthew M. Ziegler, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/392,883

(22) Filed: Dec. 28, 2016

(65) Prior Publication Data
US 2017/0109456 A1    Apr. 20, 2017

Related U.S. Application Data

(63) Continuation of application No. 14/584,316, filed on Dec. 29, 2014.

(60) Provisional application No. 62/084,340, filed on Nov. 25, 2014.

(51) Int. Cl.
*G06F 17/50* (2006.01)

(52) U.S. Cl.
CPC ........ *G06F 17/505* (2013.01); *G06F 17/5081* (2013.01)

(58) Field of Classification Search
CPC ............... G06F 17/505; G06F 17/5022; G06F 17/5054; G06F 17/5072; G06F 2217/08; G06F 17/5081
See application file for complete search history.

(56) References Cited

U.S. PATENT DOCUMENTS

2010/0218146 A1 *  8/2010  Platzker ................ G06F 17/505
                                                        716/103

OTHER PUBLICATIONS

"On Parameter Tuning in Search Based Software Engineering", Andrea Arcuri, Gordon Fraser, @Springer-Verlag Berlin Heidelerg 2011.*

(Continued)

*Primary Examiner* — Nha Nguyen
(74) *Attorney, Agent, or Firm* — Tutunjian & Bitetto, P.C.; Rabin Bhattacharya

(57) ABSTRACT

A method and system are provided for tuning parameters of a synthesis program for a design description. The method includes (a) ranking individual parameter impact by evaluating a design-cost function of each of the parameters. The method further includes (b) creating a set of possible parameter combinations that is ordered by an estimated-cost function. The method additionally includes (c) selecting, from the set of possible parameter combinations, top-k scenarios having best estimated costs to form a potential set, and running at least some of the top-k scenarios in parallel through the synthesis program. The method also includes (d) repeating steps (b)-(c) for one or more iterations until at least one of a maximum iteration limit is reached and an exit criterion is satisfied.

14 Claims, 9 Drawing Sheets

(56) References Cited

OTHER PUBLICATIONS

Arcuri, A., et al. "Parameter Tuning or Default Values? An Empirical Investigation in Search-Based Software Engineering" Empirical Software Engineering, vol. 18, No. 3. Jun. 2013. pp. 1-31.

Ziegler, M., et al. "Power Reduction by Aggressive Synthesis Design Space Exploration" Symposium on Low Power Electronics and Design. Sep. 2013. (6 Pages).

Ziegler, M., et al. "POWER8 Design Methodology Innovations for Improving Productivity and Reducing Power" IEEE Custom Integrated Circuit Conference (CICC), Sep. 2014. (9 Pages).

Ziegler, M., et al. "Synthesis Tuning System for VLSI Design Optimization" U.S. Appl. No. 14/290,886, filed May 29, 2014. (35 Pages).

List of IBM Patents or Patent Applications Treated as Related dated Dec. 28, 2016, 2 Pages.

* cited by examiner

ENHANCED PARAMETER TUNING FOR VERY-LARGE-SCALE INTEGRATION SYNTHESIS

BACKGROUND

Technical Field

The present invention relates generally to circuit synthesis and, in particular, to enhanced parameter tuning for very-large-scale integration synthesis.

Description of the Related Art

The design of modern digital very-large-scale integration (VLSI) circuits increasingly relies on circuit synthesis techniques. Even high-performance critical components that were conventionally implemented using custom design techniques (i.e., those based on schematic entry followed by placement and routing as opposed to synthesis which automates the design process beginning at the Register Transfer Level (RTL)) are now being synthesized using advanced synthesis tools. Improving design productivity and enhancing design flexibility are just a few of the benefits of synthesis-centric design methodologies. However, the shift from custom design to synthesis requires that synthesis tools tackle more difficult designs. Furthermore, as technology scaling provides diminishing performance improvements in advanced nodes, there is a greater need to optimize the synthesis results to realize the performance goals of a chip.

Advanced synthesis tools provide a large number of knobs, settings, and parameters that can greatly impact the quality of results for a specific design. The number of tunable parameters in a synthesis tool can be on the order of hundreds or even thousands of options in some cases. Quite often fine tuning many of these options is needed to achieve the quality of results needed for modern VLSI circuits. In fact, the modification of parameters can have such a large impact on the quality of results, that tuning synthesis parameters is one of most effective approaches to design optimization. In many cases, parameter tuning can lead to a wide range of quality of results, with a marked increase in quality achievable (over default synthesis results) by modifying synthesis parameters in terms of timing and power.

However, while varying parameter settings can have a large impact on the quality of results, the process of finding the correct parameter settings can often be tedious and non-intuitive for even experienced human designers. Novice designers often find that manually trying to determine the correct parameter settings is an even more daunting task.

Thus, techniques for automating the process of tuning synthesis parameters would be desirable.

SUMMARY

According to an aspect of the present principles, a method is provided for tuning parameters of a synthesis program for a design description. The method includes (a) ranking individual parameter impact by evaluating a design-cost function of each of the parameters. The method further includes (b) creating a set of possible parameter combinations that is ordered by an estimated-cost function. The method additionally includes (c) selecting, from the set of possible parameter combinations, top-k scenarios having best estimated costs to form a potential set, and running at least some of the top-k scenarios in parallel through the synthesis program. The method also includes (d) repeating steps (b)-(c) for one or more iterations until at least one of a maximum iteration limit is reached and an exit criterion is satisfied.

According to another aspect of the present principles, a system is provided for tuning parameters of a synthesis program for a design description. The system includes a memory. The system further includes at least one processor device, coupled to the memory. The at least one processor device is operative to (a) rank individual parameter impact by evaluating a design-cost function of each of the parameters. The at least one processor device is further operative to (b) create a set of possible parameter combinations that is ordered by an estimated-cost function. The at least one processor device is additionally operative to (c) select, from the set of possible parameter combinations, top-k scenarios having best estimated costs to form a potential set, run at least some of the top-k scenarios in parallel through the synthesis program. The at least one processor device is also operative to (d) repeat steps (b)-(c) for one or more iterations until at least one of a maximum iteration limit is reached and an exit criterion is satisfied.

According to yet another aspect of the present principles, a computer program product is provided for tuning parameters of a synthesis program for a design description. The computer program product includes a computer readable storage medium having program instructions embodied therewith. The program instructions are executable by a computer to cause the computer to (a) rank individual parameter impact by evaluating a design-cost function of each of the parameters. The program instructions are executable by the computer to further cause the computer to (b) create a set of possible parameter combinations that is ordered by an estimated-cost function. The program instructions are executable by the computer to additionally cause the computer to (c) select, from the set of possible parameter combinations, top-k scenarios having best estimated costs to form a potential set, and run at least some of the top-k scenarios in parallel through the synthesis program. The program instructions are executable by the computer to also cause the computer to (d) repeat steps (b)-(c) for one or more iterations until at least one of a maximum iteration limit is reached and an exit criterion is satisfied.

These and other features and advantages will become apparent from the following detailed description of illustrative embodiments thereof, which is to be read in connection with the accompanying drawings.

BRIEF DESCRIPTION OF THE DRAWINGS

The disclosure will provide details in the following description of preferred embodiments with reference to the following figures wherein.

DETAILED DESCRIPTION

The present principles are directed to enhanced parameter tuning for very-large-scale integration synthesis.

In an embodiment, an automated system and corresponding methods are provided for tuning synthesis parameters to optimize a circuit design for one of more design objectives and/or constraints. The present system is referred herein as a "Synthesis Tuning System" or "SynTunSys" in short. SynTunSys can be used in conjunction with an existing circuit synthesis tool and controls the process of tuning synthesis parameters. As will be described in detail below, the present system explores the parameter design space by submitting multiple scenario settings in parallel, evaluating the results of each scenario using a cost function, and then submitting new and more complex scenarios based on the results of the previous scenarios. The process iterates to hone in on settings that improve the results until a convergence criteria is met. The task essentially boils down to a parameter search to finding the best settings for numerous parameters to best optimize the design goals. While the present techniques are described below in the context of tuning circuit synthesis parameters, the present techniques are more broadly applicable to any parameter optimization problem.

As used herein, the term "primitive" refers to an atomic combination of effective parameters. Moreover, the term "scenario" refers to a combination of primitives. Also, the term "signature" refers to a primitive ranking.

Figure 1:
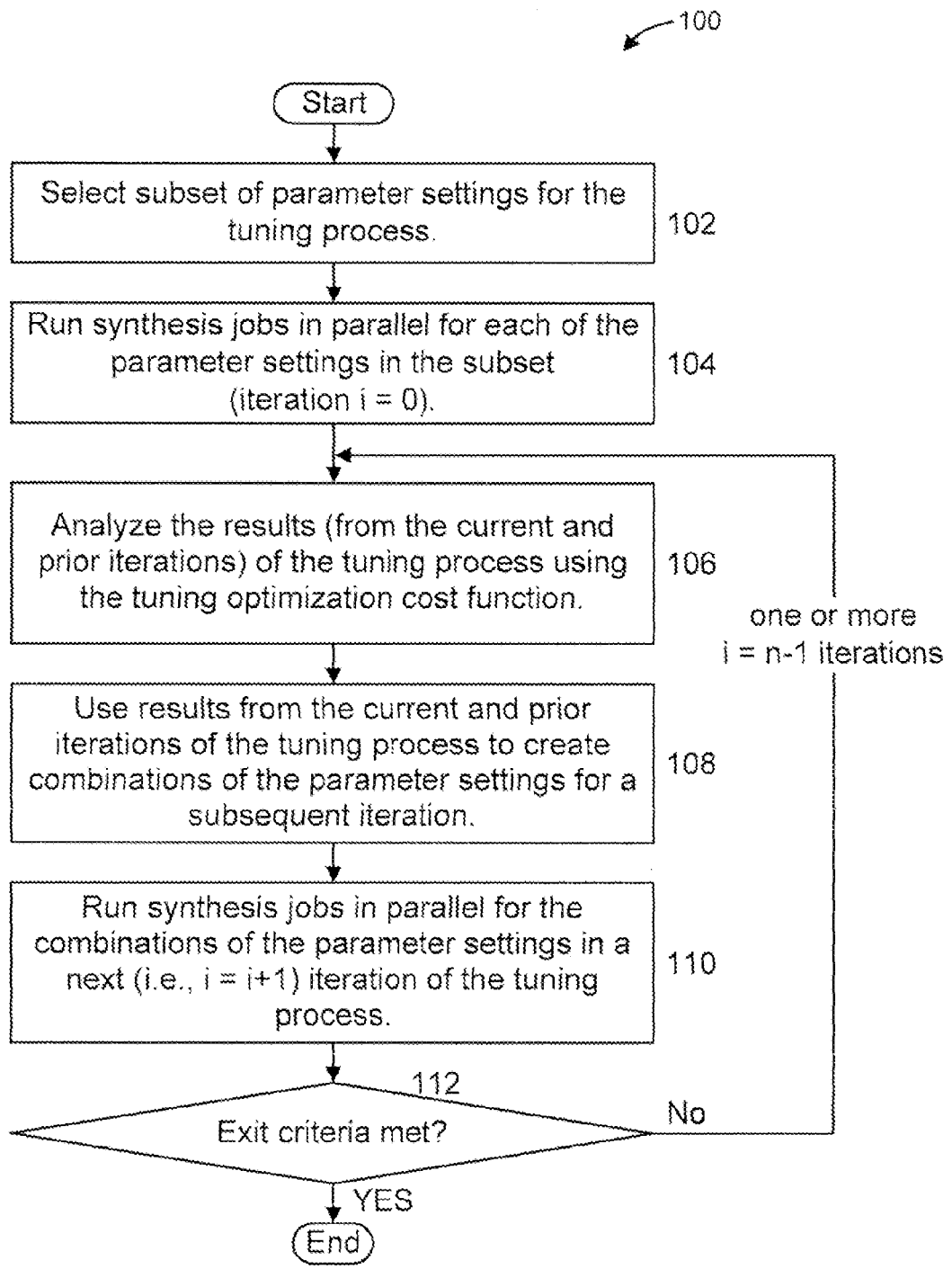
FIG. 1 shows an exemplary method 100 for tuning input parameters to a synthesis program according to an embodiment of the present invention.

A general description of the present techniques for tuning input parameters to a synthesis program is provided by way of reference to method 100 of FIG. 1 followed, by way of references to FIGS. 2-9, by the description of an exemplary implementation of the present techniques in the context of optimizing parameters in a circuit synthesis process. Referring first to FIG. 1, in step 102, an initial subset of possible parameter settings for the synthesis is selected based on a tuning optimization cost function. As will be described in detail below, the possible parameter settings (or "primitives") may be provided as input data to the present process via a primitives library, along with the tuning optimization cost function and other data via a Rules file as well as synthesis input data for circuit level synthesis via a synthesis data database. The primitives selected for a specific tuning run in step 102 may be a subset of primitives in the primitives library, which may reduce the tuning search space up front. The initial subset of primitives for a specific tuning run will be primitives that are expected to perform well with respect to the cost function of the specific tuning run. By way of example only, the criteria for selecting the initial primitive subset may be based on an automated analysis of historical performance of primitives across past tuning runs with respect to the cost function, as described in section 2, below. Likewise, the tuning program user may select or modify the initial primitive subset based on experience and/or intuition. As will be described in detail below, according to one exemplary implementation of the present techniques, the synthesis program may include a circuit synthesis program wherein the parameter settings are circuit synthesis parameter settings.

In step 104, synthesis jobs are run in parallel for each of the parameter settings in the subset (selected in step 102). By running each primitive/parameter setting individually, the sensitivity of the process to each parameter setting can be ascertained in this first (i.e., i=0) iteration of (tuning) method 100. Namely, as described below, in subsequent iterations of the method, multiple primitives will be combined and analyzed, e.g., in an attempt to improve the results over any given one primitive.

Once all of the synthesis jobs in the first iteration have completed, or alternatively a large enough fraction of the synthesis jobs in the first iteration have completed (i.e., a user-specified percent of synthesis jobs, e.g., 90%) and/or a (predetermined) time limit, in step 106 the results from the current and prior iterations (if any) of the synthesis program are analyzed using the tuning optimization cost function. In a first run of method 100, the first i=0 iteration is the current iteration, and there are no prior iterations. However, in subsequent (1<=i<=n-1) iterations of method 100, the analysis in step 106 is performed for the current iteration and is performed for all prior iterations of method 100. The percent completion requirement and the run time limit options are in place to avoid excessively long run time of an iteration, which may be held up by a small number of synthesis jobs. According to an exemplary embodiment, the tuning optimization cost function is used to represent multiple design metrics with a single cost number, i.e., as described below the tuning optimization cost function is configured to convert multiple design metrics (e.g., timing, power, and congestion metrics) into a single cost number that can be used to rank the results. By way of example only, as described in detail below, the particular metrics can be selected by a user(s). The user(s) may also specify the importance of each of the selected metrics to the design by applying weights to the metrics. The tuning optimization cost function may then be expressed as a weighted sum of the design metrics.

In step 108, the results from the first (i=0) iteration of the synthesis program are then used to create combinations of the parameter settings for subsequent iterations. For instance, according to an exemplary embodiment, the tuning optimization cost function is used to rank the results from the first iteration, e.g., from a lowest cost (best result), to a highest cost (worst) result.

Further, after a cost ranking of the results, a potential set is created consisting of the top-k scenarios based on the predicted cost of the scenarios. Additionally, in order to leverage the knowledge of experienced designers, the process may permit users/designers to influence the potential set. For instance, a designer might know of a scenario (e.g., a combination of primitives/parameter settings) that performs well, but that is not part of the potential. The user/designer may be given the option to actively place that data in the potential set.

As will be described in detail below, the primitive/parameter setting combinations may also be created in step 108 using formula-based guesses, e.g., by i) combining all of the parameter settings in the survivor set, ii) combining the N lowest cost parameter settings, or iii) combining all parameter settings that lower cost below a certain predetermined amount (e.g., lower than a reference parameter setting (s). Yet further, the primitive/parameter setting combinations may further be created in step 108 using historical data to guide selection of the parameter settings for a particular design. By way of example only, according to an exemplary embodiment, an archive of historical data (i.e., data relating to each of the tuning runs which have been performed in the past) is maintained. The results of the first iteration can be used to search the archive. For instance, as described in detail below, a clustering process may be implemented with the results obtained from the first iteration of the process as a clustering signature to cluster the data in the archive and thereby find (historical) data in the archive similar to the design space of the primitives.

Based on the combinations of primitives created in step 108, in step 110 synthesis jobs are run in parallel for the combinations of the parameter settings in a next (i.e., i=i+1) iteration of the synthesis program. Method 100 is performed iteratively to hone in on parameter settings that improve the results until an exit criteria has been met. Thus, in step 112 a determination is made as to whether (or not) the exit criteria have been met. The exit criteria might simply be that a predetermined number of iterations have been performed. Namely, the user might set a maximum limit on the number of iterations to be run. Further, as provided above the goal is to iteratively hone in on settings that improve the results. Thus, in addition (or alternatively) to a predetermined number of runs, one might consider the process complete when a run fails to improve results from one or more previous iterations.

If the exit criteria are met, then in step 114 the process is ended. On the other hand, if the exit criteria is not met then, as shown in FIG. 1, steps 106-112 are repeated for one or more additional i=n−1 iterations (until an exit criteria has been met).

Figure 2:
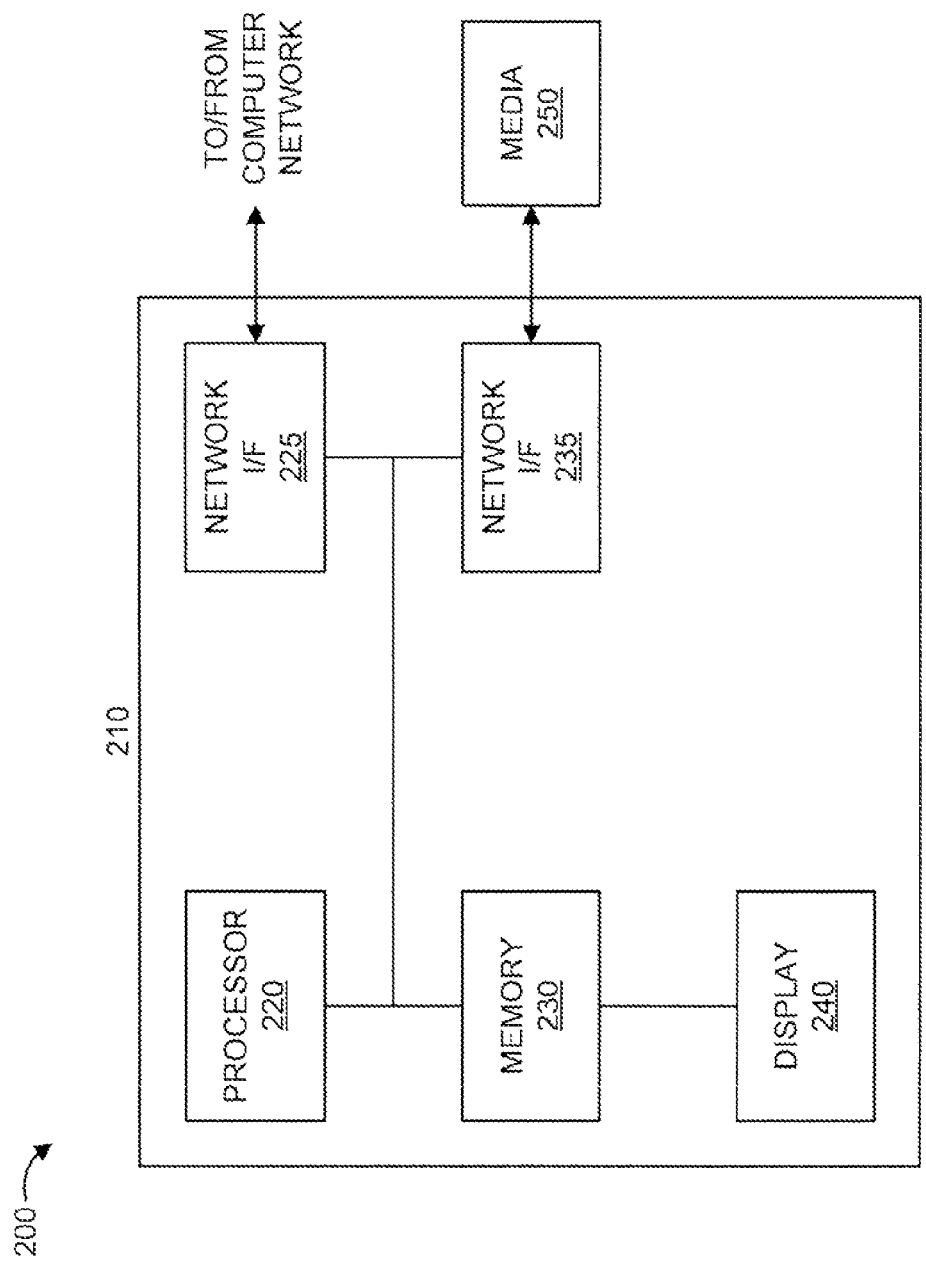
FIG. 2 shows an exemplary system 200 to which the present principles can be applied, in accordance with an embodiment of the present principles.

FIG. 2 shows an exemplary system 200 to which the present principles can be applied, in accordance with an embodiment of the present principles.

System 200 comprises a computer system 210 and removable media 250. Computer system 210 comprises a processor device 220, a network interface 225, a memory 230, a media interface 235 and a display 240. Network interface 225 allows computer system 210 to connect to a network, while media interface 235 allows computer system 210 to interact with media, such as a hard drive or removable media 250.

Processor device 220 can be configured to implement the methods, steps, and functions disclosed herein. The memory 230 could be distributed or local and the processor device 220 could be distributed or singular. The memory 230 could be implemented as an electrical, magnetic or optical memory, or any combination of these or other types of storage devices. Moreover, the term "memory" should be construed broadly enough to encompass any information able to be read from, or written to, an address in the addressable space accessed by processor device 220. With this definition, information on a network, accessible through network interface 225, is still within memory 230 because the processor device 220 can retrieve the information from the network. It should be noted that each distributed processor that makes up processor device 220 generally contains its own addressable memory space. It should also be noted that some or all of computer system 210 can be incorporated into an application-specific or general-use integrated circuit.

Display 240 is any type of display suitable for interacting with a human user of apparatus 200. Generally, display 240 is a computer monitor or other similar display.

Of course, system 200 may also include other elements (not shown), as readily contemplated by one of skill in the art, as well as omit certain elements. For example, various other input devices and/or output devices can be included in system 200, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the system 100 are readily contemplated by one of ordinary skill in the art given the teachings of the present principles provided herein.

Figure 3:
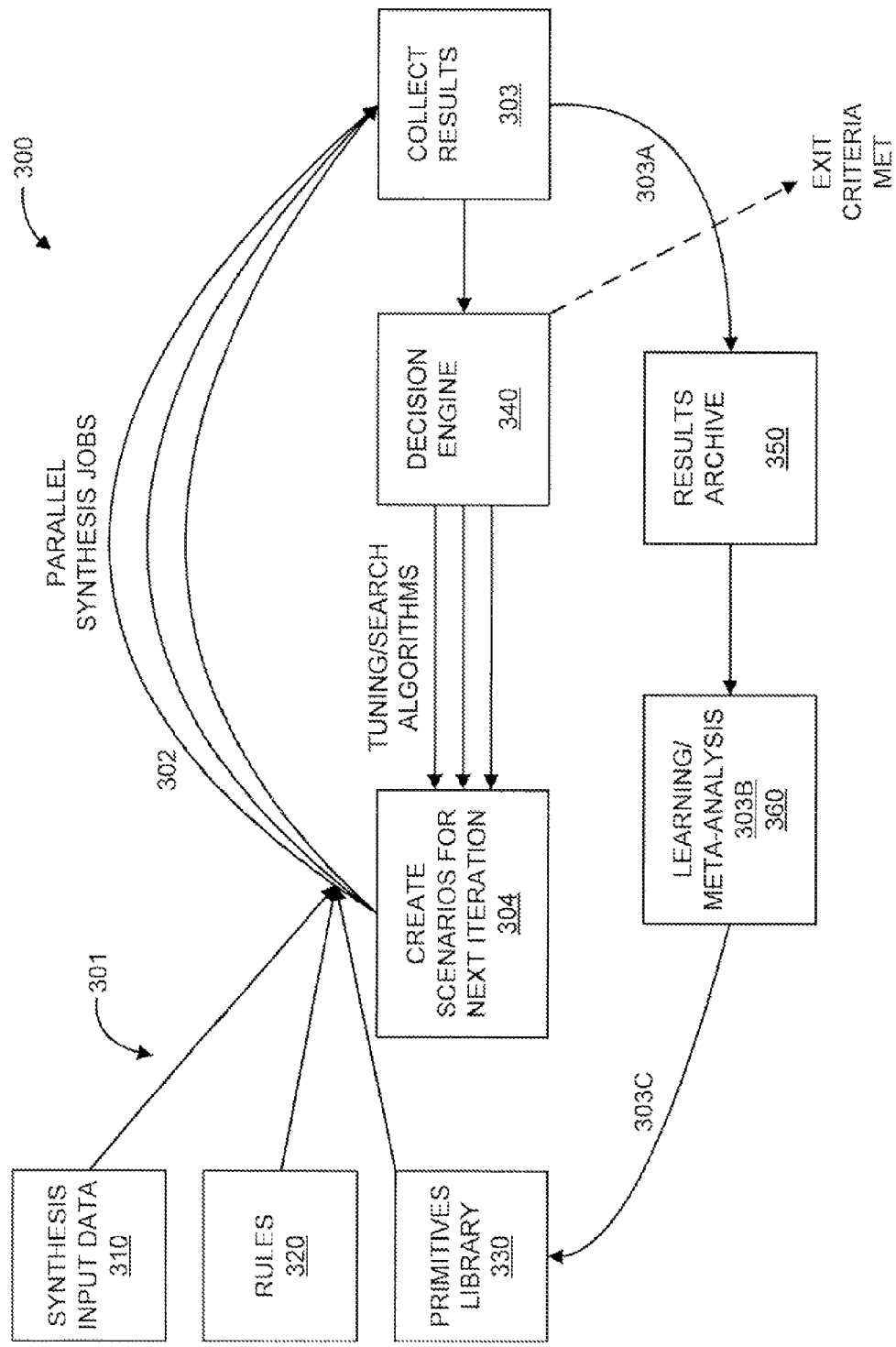
FIG. 3 shows an exemplary automated system 300 for tuning input parameters to a synthesis program, in accordance with an embodiment of the present principles.

Moreover, it is to be appreciated that system 300 described below with respect to FIG. 3 is a system for implementing respective embodiments of the present principles. Part or all of system 200 may be implemented in one or more of the elements of system 300.

Figure 4:
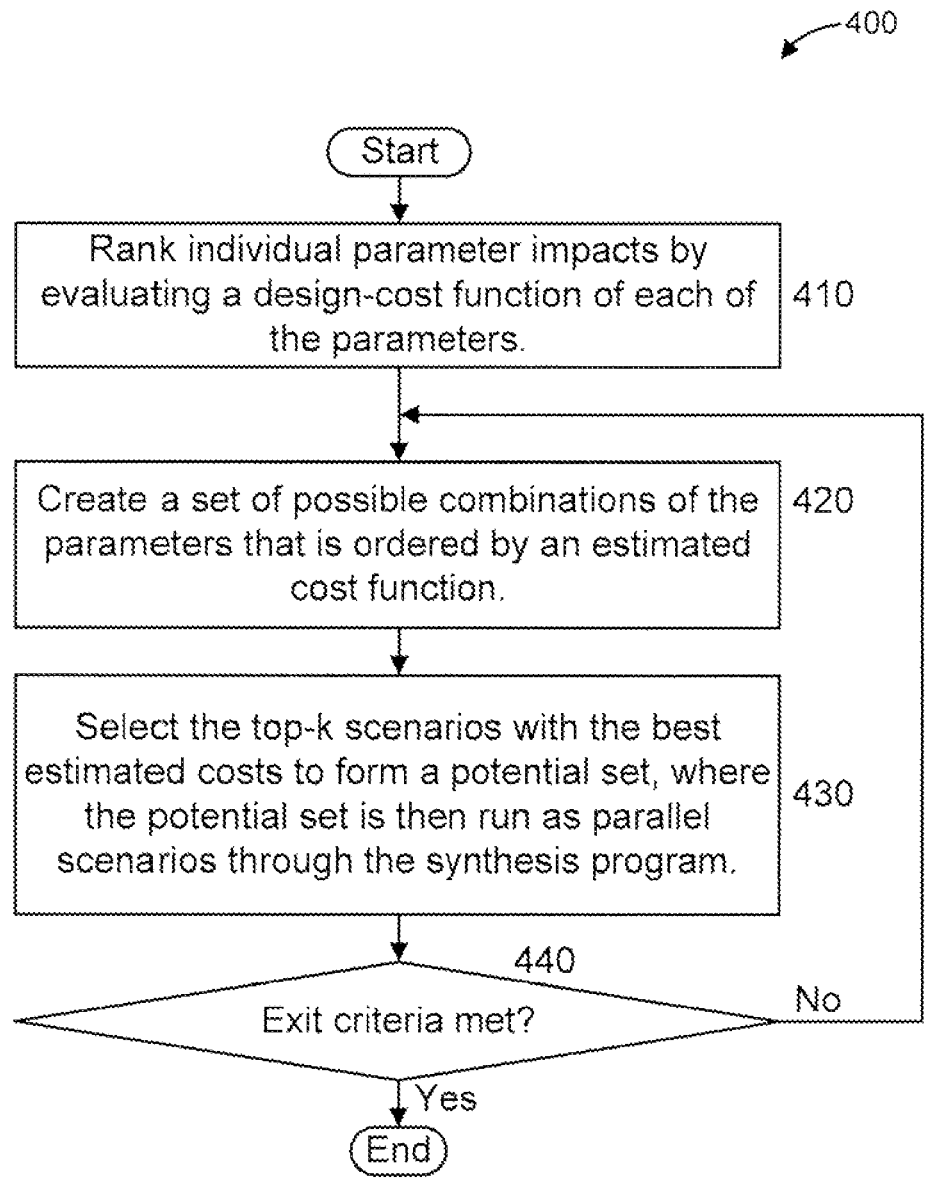
FIG. 4 shows an exemplary method 400 for adaptive scenario exploration, in accordance with an embodiment of the present principles.
Figure 6:
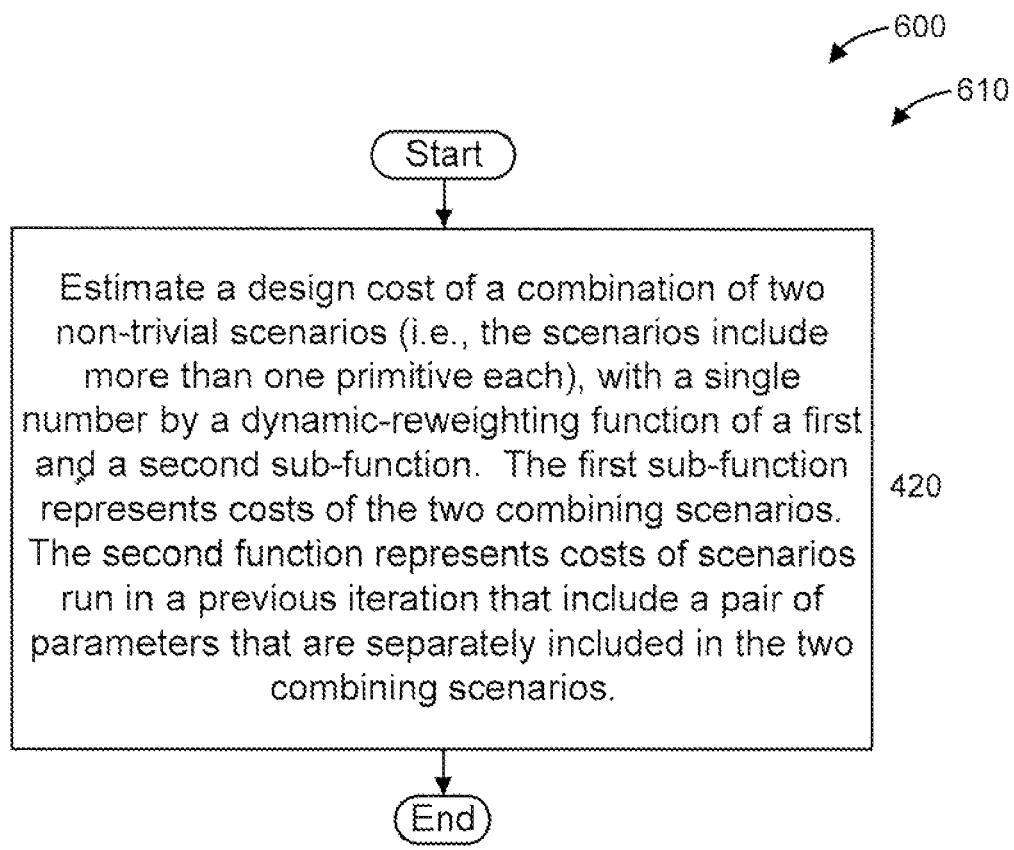
FIG. 6 shows an exemplary method 600 for adaptive scenario exploration with fine-grained learning, in accordance with an embodiment of the present principles.
Figure 8:
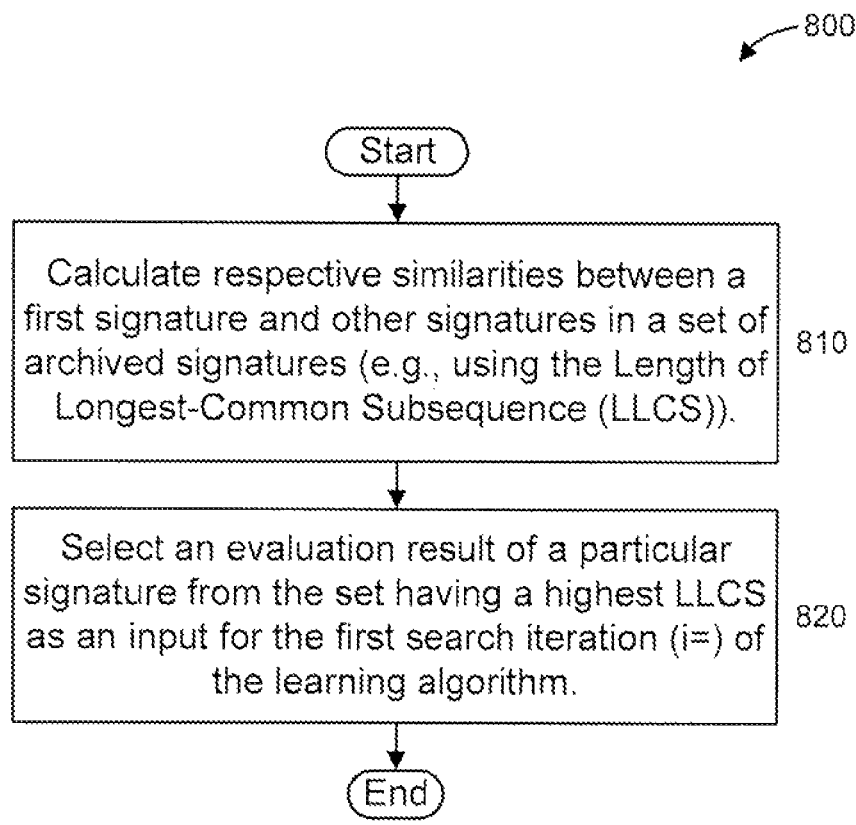
FIG. 8 shows an exemplary jump-start method 800 for performing a lightweight sensitivity test, in accordance with an embodiment of the present principles.

Further, it is to be appreciated that system 200 may perform at least part of the method described herein including, for example, at least part of method 400 of FIG. 4 and/or at least part of method 600 of FIG. 6 and/or at least part of method 800 of FIG. 8. Similarly, part or all of system 300 may be used to perform at least part of method 400 of FIG. 4 and/or at least part of method 600 of FIG. 6 and/or at least part of method 800 of FIG. 8.

FIG. 3 shows an exemplary automated system 300 for tuning input parameters to a synthesis program, in accordance with an embodiment of the present principles. The system 300 performs a tuning process. As shown in FIG. 3, the tuning process begins at step 301. The system 300 takes the following macro (e.g., a circuit partition) synthesis input data as well as SynTunSys input data: standard synthesis input data for circuit level synthesis (labeled "Synthesis Input Data" 310); a SynTunSys "Rules" file (labeled "Rules" or "Rules file" 320); and a library of primitives (labeled "Primitive Library" 330). The Synthesis Input Data 310 includes, for example, but is not limited to, a register transfer level (RTL) description, a physical abstract providing macro boundaries and pin locations, and timing assertions. The Rules 320 describe, for example, but are not limited to, the "primitives" or parameter settings to be explored, a tuning optimization cost function to be optimized, and potentially other additional options (as described below). The Primitive Library 330 includes the detailed definitions of all possible options, i.e., parameter settings, capable of being explored. The Rules file 320 selects a subset of the possible options based on the tuning optimization cost function to be optimized.

The system 300 performs a process that begins by taking as input the synthesis input data 310, the Rules file 320, and the primitives 330, and runs multiple synthesis scenarios in parallel (step 302) based on the primitives in the Rules file 320. When all jobs are complete, or a large enough fraction of jobs are complete (i.e., a user-specified percent of synthesis jobs, e.g., 90%), or a time limit is reached, or some other exit criteria has been satisfied, a results collection process (see step 303) is initiated which collects the results of the parallel synthesis jobs. The results of the parallel synthesis jobs are archived (e.g., in a results archive 350) (step 303A). A learning technique and/or meta-analysis are/is applied to the results of the parallel synthesis jobs by an expert analysis system 360 (labeled "Learning/Meta-Analysis") (step 303B).

Based on the collected results, a decision engine 340 via a tuning process is used to create a new set of the scenarios (synthesis parameter settings) to be run in the next iteration (step 304). These new jobs begin with the initial input data and are also run in parallel, i.e., the next iteration does not modify the output of the prior iteration, but re-synthesizes the macro from the beginning. The process iterates attempting to improve upon results until an exit criteria is met. This flow will be described in further detail below.

The result archive 350 is a database-like storage system that archives the input parameters and results for the scenarios run via SynTunSys. The results archive 350 holds historical data across different projects, macros, and users. Once a sufficient amount of data is archived (i.e., a sufficient amount of data such that statistical trends can be observed), the results archive 350 can be data mined and analytics can be applied (by the expert analysis system 360) for a variety of goals. Another exemplary use is to determine which initial primitives are effective for certain design goals, e.g., timing, power, congestion improvement, and so forth (see step 303C).

Figure 5:
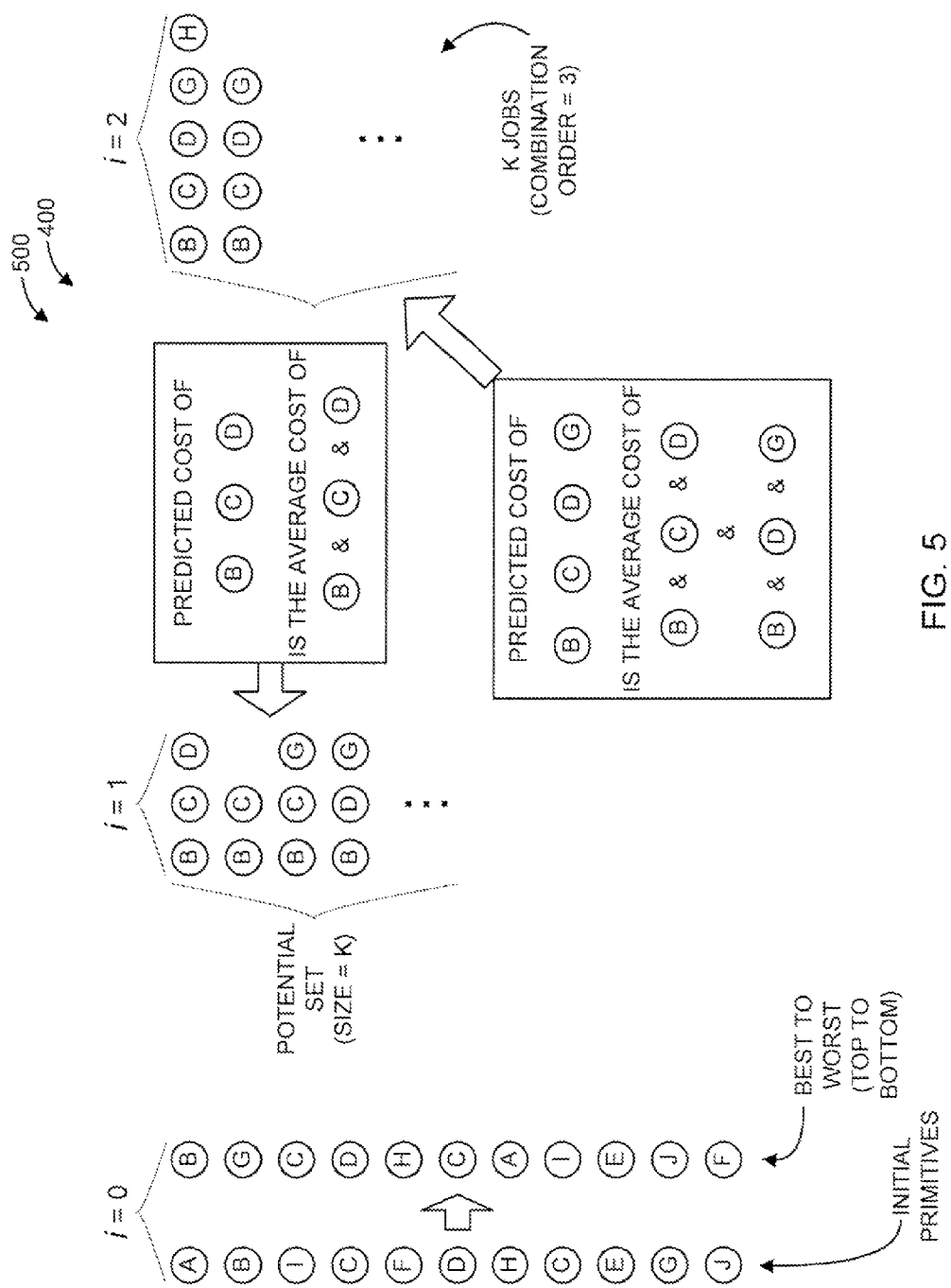
FIG. 5 shows a graphical example 500 of method 400, in accordance with an embodiment of the present principles.

FIG. 4 shows an exemplary method 400 for adaptive scenario exploration, in accordance with an embodiment of the present principles. FIG. 5 shows a graphical example 500 of method 400, in accordance with an embodiment of the present principles.

At step 410, rank individual parameter impacts by evaluating a design-cost function of each of the parameters input to a synthesis program for a design description. In the embodiment of FIG. 5, they are ranked from best to worst from top to bottom. Of course, other ranking conventions can also be used, while maintaining the spirit of the present principles.

At step 420, create a set of possible combinations of the parameters that is ordered by an estimated cost function.

At step 430, select the top-k scenarios with the best estimated costs to form a potential set, where the potential set is then run as parallel scenarios through the synthesis program.

At step 440, determine whether or not exit criteria have been met. If so, then the method is terminated. Otherwise, the method returns to step 420, so as to repeat steps 420-430 for one or more iterations until the exit criteria have been met.

The method 400 is a learning method which can adapt to the scenarios that are more likely to return better costs (according to the cost function) as the method 400 proceeds, without being restricted in the survivor set. The starting iteration (i=0) (step 410) is a sensitivity (design-cost impact) test on the input primitives. In the next iteration (i=1) (step 420), the learning method 400 takes the average cost of contributing scenarios (e.g., the scenarios with the B, C, and D primitives alone) as an exemplary cost predictor for estimating the cost of the composite scenario (B+C+D). By doing the cost estimation, the learning algorithm selects the top-k scenarios with the best estimated costs to form a potential set.

In an embodiment, the number of contributing scenarios is limited to a user-defined combination order, such that the total number of scenario combinations would not explode to make the cost estimation infeasible. At the end of the iteration (i=1) 420, SynTunSys submits k synthesis jobs with the selected composite scenarios. The estimation-selection-submission process repeats for every iteration (i>=1) until an exit criterion is met. The exit criterion could either be a predetermined number of iterations or based on an exit criteria evaluation algorithm. An exemplary exit evaluation algorithm is described hereinafter and referred to as the "Iteration Momentum Test for Completion".

We now describe base SynTunSys control process details, in accordance with an embodiment of the present principles. The underlying process that controls the scenarios explored during each iteration is also referred to herein as "the control algorithm". The process can employ a pseudo-genetic algorithm. This is however only one potential control algorithm that the SynTunSys could employ. That is, given the teachings of the present principles provided herein, one of ordinary skill in the art will readily appreciate other control algorithms that can be applied in accordance with the teachings of the present principles, while maintaining the spirit of the present principles. In FIG. 5, each circle with a letter in it represents a primitive. Each primitive consists of one or more synthesis parameters set to a specific value. Each primitive performs an atomic action and was constructed by an expert user sometime in the past and added to an official library. Examples of primitive actions are: set logic decomposition directives, set native VT (i.e., transistor threshold voltage), and swap VT levels, or set latch configurations, etc. The underlying synthesis parameters may be set to integer or string values (non-Boolean), making potential space of the settings large. On the other hand, primitives contain synthesis parameters with specific settings. This makes primitives Boolean in nature, i.e., a primitive is either used or not. In addition, the total number of primitives available is far less than the natively available synthesis parameters. Therefore using primitives reduces the design space search from 1000's of multi-valued parameter settings to 100's of Boolean primitives.

From the 100's of available primitives, a subset are chosen for exploration based on the goals of the tuning optimization cost function, which may be a combination of timing, power, and congestion metrics. As provided above, the initial subset of primitives for a specific tuning run will be primitives that are expected to perform well with respect to the cost function of the specific tuning run based, for example, on an automated analysis of historical performance of primitives across past tuning runs with respect to the cost function and/or experience/intuition of the tuning program user. The selected primitives, cost function, and additional tuning options are set in the Rules file (described in further detail below). The SynTunSys process begins by reading the Rules file and launching a first iteration (i=0) which runs parallel synthesis jobs for each primitive in the rules file. As described above, each synthesis job in i=0 has only the single primitive enabled, thus i=0 tests the sensitivity of each primitive. The SynTunSys monitor process tracks each synthesis job. When either all jobs complete, or a large enough fraction of jobs complete (i.e., a user-specified percent of synthesis jobs, e.g., 90%), or a time limit is reached, the monitor process initiates a results collection process which collects the results of the parallel synthesis jobs. The results of each synthesis job are analyzed by the tuning optimization cost function and ranked from lowest cost (best) to highest cost (worst). From this cost ranked list a "potential set" is chosen. The size of the potential set may be set by the user in the Rules file or be dynamically set by the program based on available compute resources. The size of the survivor set influences the number of synthesis jobs in the tuning run. For example, in some cases the user may want to reduce the number of synthesis jobs in a tuning run to reduce the compute resource requirements. In other cases, the user may want to perform a more thorough tuning run that users more compute resources, which would be driven by a larger survivor set.

After selecting the survivor set, the process proceeds to the second iteration (i=1). During the i=1 iteration, a new set of more complex synthesis scenarios are submitted in parallel based on the sensitivity results from i=0.

Additional iterations proceed in the same manner to i=1 in that a given stream combines i+1 primitives to form more complex scenarios. Namely, according to the exemplary process illustrated in FIG. 4, a given stream does an exhaustive search of the survivor set primitives combinations, adding one primitive per iteration (i.e., i=1 combinations have two primitives, i=2 combinations have three primitives, etc.)—that is except if an early exit criteria is met or if some scenarios are estimated to not be beneficial, they are skipped. The process completes based on a number of iterations requested in the Rules file. Alternative exit criteria can also halt the process as well, e.g., if the last iteration failed to improve upon results. The final results collection looks back across all synthesis scenarios explored and cost ranks the scenarios. It is notable that the described control process is only one of a number of potential control processes that may be implemented in accordance with the present techniques.

Figure 7:
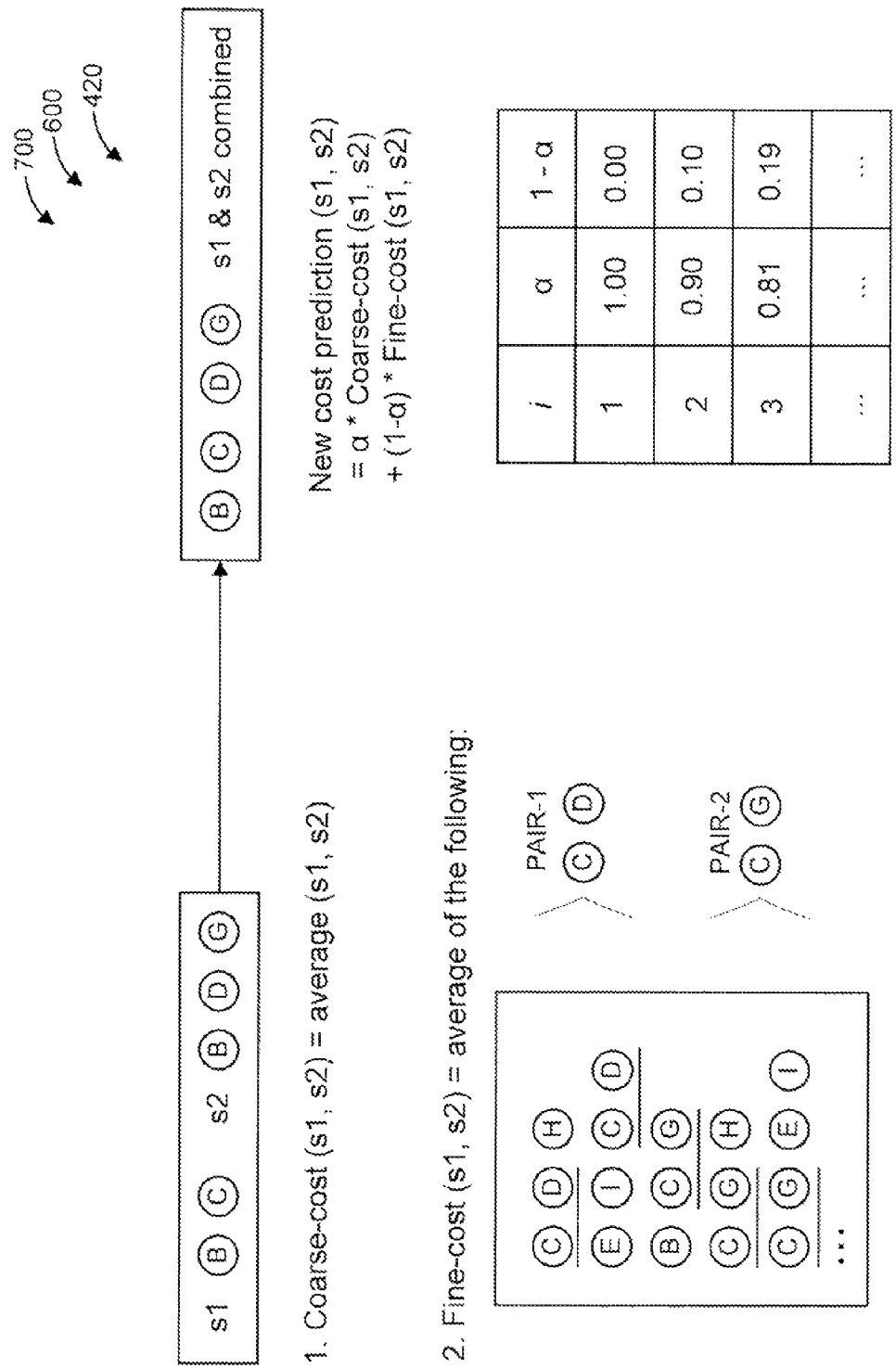
FIG. 7 shows a graphical example 700 of method 600, in accordance with an embodiment of the present principles.

FIG. 6 shows an exemplary method 600 for adaptive scenario exploration with fine-grained learning, in accordance with an embodiment of the present principles. FIG. 7 shows a graphical example 700 of method 600, in accordance with an embodiment of the present principles. In particular, FIGS. 6 and 7 further describe step 420 of FIG. 4, in accordance with an embodiment of the present principles. In the embodiment of FIG. 6, step 420 from FIG. 4 is implemented as step 610.

At step 610, estimate a design cost of a combination of two non-trivial scenarios (i.e., the scenarios include more than one primitive each), with a single number by a dynamic-reweighting function of a first and a second sub-function. The first sub-function represents costs of the two combining scenarios. The second function represents costs of scenarios run in a previous iteration that include a pair of parameters that are separately included in the two combining scenarios.

Thus, in order to better estimate the cost based on non-trivial contributing scenarios (i.e., the scenarios including more than one primitive), the learning algorithm as implemented by method 600 does more fine-grained cost estimation. Given two scenarios, s1=(B+C) and s2=(B+D+G), the learning algorithm regards the average cost of s1 and s2 as the coarse-cost, and additionally considers a fine-cost which is defined as follows. The fine-cost is the average cost of the existing scenarios that include a pair of primitives, such that one primitive comes from s1 and the other from s2. Two example pairs are given in this figure as pair-1 and pair-2. The scenarios listed to the left of pair-1 and pair-2 are the example scenarios that include the pairs. Thus, the fine-cost of s1 and s2 are the average cost of such listed scenarios. Overall, the cost-estimation function becomes a weighted sum of the coarse- and fine-cost with weighting factors alpha for the coarse-cost and (1-alpha) for the fine-cost (0<alpha<=1). An exemplary formula for determining alpha is alpha=beta$^{(i-1)}$, where 0<beta<1, and i is the current iteration number. As long as alpha decreases as the number of iteration increases (i.e., the length of composite scenarios increases as well), the learning algorithm puts less weights on the coarse-cost, while putting more weights on the fine-cost.

We now describe some exemplary variations/extensions to the learning algorithm. These variations/extensions include modifications to the predictors, the injection of new primitives for the next iteration for broader search space, and a mechanism for probabilistic selection of primitives. These variations/extensions can be enacted as algorithm phases and compared against the standard learning algorithm for fine tuning the algorithm for specific designs.

Hence, regarding modifications to the predictors, there are other possible embodiments of the cost predictors, such as using the product instead of the average of the contributing costs, using the archived cost for estimating a composite scenario which can be found in the archive, or using any other machine-learning models. The preceding predictor modifications are merely illustrative and, thus, other predictor modifications can also be used in accordance with the teachings of the present principles, while maintaining the spirit of the present principles.

Regarding the injection of new primitives, there are other possible embodiments of how the algorithm can see the candidate primitives. For example, users may provide new primitives to be considered (or forced to be used) at the beginning of each iteration, or the algorithm may switch to search in a different pool of primitives when the cost improvement diminishes to be below a certain threshold. The preceding ways in which the learning algorithm sees the candidate primitives are merely illustrative and, thus, other ways can also be used in accordance with the teachings of the present principles, while maintaining the spirit of the present principles.

Regarding the mechanism for probabilistic selection of primitives, there are other possible embodiments of how to select one primitive from a selection group. In order to escape from local optimal, the algorithm may probabilistically select any one of the primitives for scenario composition, without being restricted to the one with the best cost. The preceding mechanism for probabilistic primitive selection is merely illustrative and, thus, other probabilistic primitive selection mechanisms can also be used in accordance with the teachings of the present principles, while maintaining the spirit of the present principles.

We now describe a modification to the aforementioned sensitivity test described regarding step 410 of FIG. 4, in accordance with an embodiment of the present principles.

The default sensitivity test provides three levels of tuning effort as follows: low; medium; and high; with 19, 38, and 54 primitives, respectively. In order to reduce the overhead of the sensitivity test (i.e., to approach the high-effort exploration result based on a low-effort sensitivity test), the learning algorithm provides a jump-start capability. The idea is to run a low-effort sensitivity test as a pseudo test $T_L$, and to take $T_L$'s ranking of the primitives as a signature. Then, the algorithm retrieves, from the archive, a high-effort test $T_H$ which has the most similar ranking of primitives to $T_L$'s signature. Finally, the algorithm adopts $T_H$'s ranking as the actual result of the sensitivity test to kick off the first search iteration (i=1).

Figure 9:
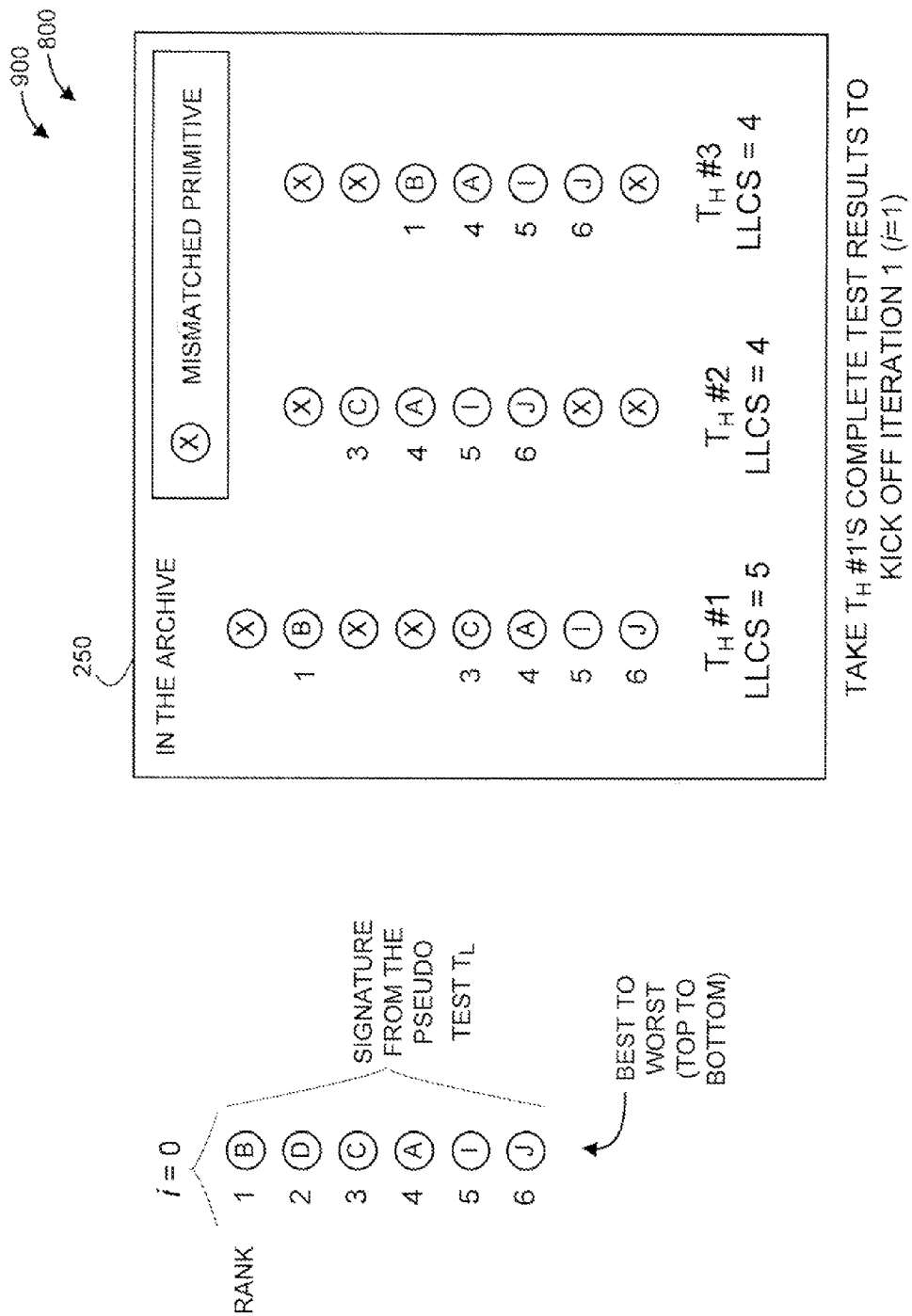
FIG. 9 shows a graphical example 900 of method 800, in accordance with an embodiment of the present principles.

FIG. 8 shows an exemplary jump-start method 800 for performing a lightweight sensitivity test, in accordance with an embodiment of the present principles. The method 800 uses signatures, i.e., primitive rankings. FIG. 9 shows a graphical example 900 of method 800, in accordance with an embodiment of the present principles.

At step 810, calculate respective similarities between a first signature and other signatures in a set of archived signatures. In an embodiment, the respective similarities can be calculated using the Length of Longest-Common Subsequence (LLCS). As an example, the longest common subsequence of two signatures (i.e. primitive rankings) "A B C D" and "A F D" is "A D" with LLCS=2. In an embodiment, higher-ranked primitives can be favored by calculating the LLCS weighted by the rank of the primitives.

At step 820, select an evaluation result of a particular signature from the set having a highest LLCS (or other metric) as an input for the first search iteration (i=1) of the learning algorithm (e.g., method 400).

Thus, one embodiment of measuring the similarity between two signatures can be based on the metric of "the Length of Longest Common Subsequence (LLCS)." For example, the longest common subsequence of two signatures (i.e. primitive rankings) "a b c d" and "a f d" is "a d" with LLCS=2. FIG. 8 illustrates a low-effort sensitivity test with 6 primitives, and in the results archive 250, the high-effort sensitivity tests with more than 6 primitives are identified and sorted according to their LLCS with respect to $T_L$'s signature. Among these high-effort tests, $T_H$ #1 has the maximum LLCS (5). Therefore, the complete sensitivity-test result of $T_H$ #1 is taken to kick off the first search iteration (i=1) of the learning algorithm.

We now describe an iteration momentum test for completion, in accordance with an embodiment of the present principles.

Instead of requiring the user to set the number of tuning iterations, an optional completion algorithm can be added to automatically end the tuning run when diminishing return is detected. In an embodiment, we perform another iteration when at least one of these criteria are met by the last iteration (iteration that just completed):

Best1 test: The last iteration produced a cost improvement over the minimum required cost improvement %, i.e., the last iteration improved upon lowest cost; and AvgBestM test: The M lowest cost solutions from the last iteration are, on average, better than the M lowest cost solutions from all previous solutions, by the minimum required cost improvement %, i.e., the last iteration produced a number of solutions that are among the top performers.

In an embodiment, particular algorithm details can include the following: Continue to Next Iteration if:

Best1>MinCostBest1%, where, Best1=$(Best_{i<N,1}-Best_{N,1})/Best_{i<N,1}$

Or

AvgBestM>MinCostAvgBestM%, where, AvgBestM= $(Avg(Best_{N,1:M})-Avg(Best_{i<N,1:M}))/Avg(Best_{i<N,1:M}))$ Else, complete tuning loop The following syntax definitions apply to the aforementioned algorithm details:

$Best_{N,1}$=lowest cost solution from the last (Nth) iteration;

$Best_{N,1:M}$=the M lowest cost solutions from the last (Nth) iteration;

$Best_{i<N,1}$=lowest cost solution from all iterations prior to N;

$Best_{i<N,1:M}$=the M lowest cost solutions from all iterations prior to N;

MinCostBest1%=minimum improvement % for Best1 test;

MinCostAvgBestM %=minimum improvement % for MinCostAvgBestM test;

The proposed learning algorithm can include a test (iteration momentum test for completion) to determine if the algorithm should proceed to the next iteration or whether it should terminate. In concept, this completion test selects proceeding to the next iteration if the last iteration produced the top solution from all iterations or if the last iteration produced a number strong solution.

More formally, one embodiment of completion test algorithm would proceed to a new iteration if one or both of the following criteria are met:

(1) if the last iteration produced the top ranking scenarios and the cost of that scenario is a certain % better than the cost of the best prior scenario; and (2) if the average cost of the top M scenarios from the last iteration is a certain % better that the average cost of the top M scenarios from all prior scenarios.

It is to be appreciated that M can be a predetermined number or can be a function of the total number of scenarios run. For example, M could be 5% of the total number of scenarios (rounded off). Thus, as the total number of scenarios grows, the number of scenarios considered for criteria 2 also grows.

We now describe the rules file 220 in further detail, in accordance with an embodiment of the present principles. In particular, we now describe some key sections of the Rules file 220, in accordance with an embodiment of the present principles. These key sections include, for example, the initial primitives, the cost function, the selection rules, and iteration control.

The initial primitives to be explored are listed in the file. By convention, the primitives have short names that represent their function. The following exemplary scenario begins the learning method and then evolves in subsequent iterations:

```
# SCENARIOS:PDSRTL
ch_a ch_t ch_at flow down flatten
lat1.nrl lat5.nrl lat6.nrl shuddle
delay1 delay2
area1 noleak
the.pi2 the.ti2 the.zi2
he1 he2 he3
ep1 ep2
bpop bpo_all0
lava_norm lava_he lava_noheur
```

The cost function syntax describes the optimization goals of the tuning run. For the following cost function syntax, power weight×3 and timing weight×3, so 3 timing components weight×1 each). The congestion weight×3, as well. In the following cost syntax, TotalNegSlack, WorstSlack, and InternalSlack are timing metrics, as follows:

```
# COSTS
! metric polarity weight
TotalPower     + 3
TotalNegSlack  - 1
WorstSlack     - 1
InternalSlack  - 1
TotalCongestion + 3
```

The selection section includes additional rules to guide the process of choosing the survivor set. The rules describe illegal combinations, i.e., only one primitive from each CHOOSE group can be chosen at a time for a scenario.

```
# SELECTION
CHOOSE : 1 : ch_a ch_t ch_at flow down flatten
CHOOSE : 1 : lat1.nrl lat5.nrl lat6.nrl shuddle
CHOOSE : 1 : delay1 delay2
CHOOSE : 1 : ep1 ep2
CHOOSE : 1 : he1 he2 he3
CHOOSE : 1 : bpop bpo_all0
CHOOSE : 1 : lava_norm lava_he lava_noheur
# THRESHOLDS
TotalNegSlack > -2000
```

The iteration control includes parameters to describe the number of scenarios per iteration, iterations to run, and whether the completion test is enabled.

```
# ITERATION_CONTROLS
SCENARIOS_PER_ITERATION 20
COMB_ORDER 2
MIN_ITERATIONS 3
MAX_ITERATIONS 5
COMPLETION_TEST true
```

It is to be noted that "SCENARIOS_PER_ITERATION" is equal to k in method 100 of FIG. 1. It is to be further noted that k could be a single user defined number used for all iterations, or could have a unique value for each iteration. Alternatively, k could be determined on the fly by the tuning system based on available compute resources. Other variations of k can also be used in accordance with the teachings of the present principles, while maintaining the spirit of the present principles.

We now describe the cost function in further detail, in accordance with an embodiment of the present principles.

The cost function, also described herein before, is used to convey the optimization goals for the tuning run. The cost function converts multiple design metrics into a single cost number, which allows cost ranking of scenarios. According to an exemplary embodiment, a user first selects one or more design metrics (e.g., timing, power, and congestion, metrics) that can be collected from a synthesis run results and applies weights to specify the importance of each of the metrics. The Rules file in FIG. 10 shows 5 exemplary design metrics that may be included in a cost function. This cost function is equally weighted for power, timing (3 timing metrics, each with a weight of 1), and congestion. The cost function for the cost calculation may be expressed as a "normalized weighted sum" of the design metrics as follows:

$$\text{Cost} = \sum_{i=1}^{m} W_i \cdot \text{Norm}(M_i) \quad (1)$$

wherein $W_i$=weight, and $M_i$=metric$_i$. It is notable that the cost calculation shown in Equation 1 is only one possible implementation. Using the exemplary design metrics shown in FIG. 5, wherein Total Power and Total Congestion are each given a weight of 3 and the 3 timing design metrics are given a weight of 1, cost may be computed as follows:

Cost=3×N(Power)+1×N(Worst Slack)+1×N(Internal Slack)+1×N(Total Negative Slack)+3×N(Congestion) (2)

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A system for tuning parameters of a synthesis program for a design description, the system comprising:
 a processor, coupled to a memory, operative to:
  (a) rank individual parameter impact by evaluating a design-cost function of each of the parameters;
  (b) create an ordered set of possible parameter combinations based on the ranked individual parameter;
  (c) select, from the set of possible parameter combinations, top-k scenarios having best estimated costs to form a potential set, run at least some of the top-k scenarios through the synthesis program;
  (d) repeat steps (b)-(c) for one or more iterations for a different set of possible parameter combinations until an exit criterion is satisfied; and
  (e) generate an optimized circuit design based on the selected top-k scenarios.

2. The system of claim 1, wherein the design-cost function of the step (a) represents multiple design metrics with a single cost number.

3. The system of claim 1, wherein the processor ranks the individual parameter impact by:
 evaluating an impact of a first set of parameters on a design under tuning, the parameters in the first set being user specified; and
 taking the evaluation result of a second set of parameters being evaluated for different design descriptions and having a most similar impact to the first set on the design under tuning as an initial set to be ranked, where the set second is a superset of the first set.

4. The system of claim 1, wherein the processor ranks the individual parameter impact using a similarity function to represent impacts of two sets of parameters on two design descriptions with a single similarity number.

5. The system of claim 1, wherein the processor creates the set of possible parameter combinations by estimating a design cost of a scenario, formed from a combination of two parameters, with a single number using an estimation function of individual costs of the two parameters, to simulate the scenario being run through the synthesis program.

6. The system of claim 1, wherein the processor creates the set of possible parameter combinations by estimating a design cost of a combination of two scenarios having more than one primitive each, with a single number using a dynamic-reweighting function of a first and a second sub-function, the first sub-function representing costs of the two scenarios, the second function representing costs of scenarios run in previous iterations that include a pair of parameters that are separately included in the two scenarios.

7. The system of claim 1, wherein the exit criterion is determined to be satisfied using a completion test that comprises determining whether the last iteration has produced (i) a scenario having a lowest cost of all scenarios from all prior iterations or (ii) a number of scenarios having lower costs relative to at least some prior iterations, wherein the completion test determines the exit criteria has been met when both (i) and (ii) are false.

8. A computer program product for tuning parameters of a synthesis program for a design description, the computer program product comprising a computer readable storage medium having program instructions embodied therewith, the program instructions executable by a computer to cause the computer to:
  (a) rank individual parameter impact by evaluating a design-cost function of each of the parameters;
  (b) create an ordered set of possible parameter combinations based on the ranked individual parameter;
  (c) select, from the set of possible parameter combinations, top-k scenarios having best estimated costs to form a potential set, and run at least some of the top-k scenarios through the synthesis program;
  (d) repeat steps (b)-(c) for one or more iterations for a different set of possible parameter combinations until an exit criterion is satisfied: and
  (e) generate an optimized circuit design based on the selected top-k scenarios.

9. The computer program product of claim 8, wherein the design-cost function of the step (a) represents multiple design metrics with a single cost number.

10. The computer program product of claim 8, wherein the individual parameter impact is ranked by:
  evaluating an impact of a first set of parameters on a design under tuning, the parameters in the first set being user specified; and
  taking the evaluation result of a second set of parameters being evaluated for different design descriptions and having a most similar impact to the first set on the design under tuning as an initial set to be ranked, where the set second is a superset of the first set.

11. The computer program product of claim 8, wherein the individual parameter impact is ranked using a similarity function to represent impacts of two sets of parameters on two design descriptions with a single similarity number.

12. The computer program product of claim 8, wherein the set of possible parameter combinations is created by estimating a design cost of a scenario, formed from a combination of two parameters, with a single number using an estimation function of individual costs of the two parameters, to simulate the scenario being run through the synthesis program.

13. The computer program product of claim 8, wherein the set of possible parameter combinations is created by estimating a design cost of a combination of two scenarios having more than one primitive each, with a single number using a dynamic-reweighting function of a first and a second sub-function, the first sub-function representing costs of the two scenarios, the second function representing costs of scenarios run in previous iterations that include a pair of parameters that are separately included in the two scenarios.

14. The computer program product of claim 8, wherein the exit criterion is determined to be satisfied using a completion test that comprises determining whether the last iteration has produced (i) a scenario having a lowest cost of all scenarios from all prior iterations or (ii) a number of scenarios having lower costs relative to at least some prior iterations, wherein the completion test determines the exit criteria has been met when both (i) and (ii) are false.

\* \* \* \* \*